United States Patent [19]
Wada

[11] Patent Number: 5,475,645
[45] Date of Patent: Dec. 12, 1995

[54] MEMORY MODULE USING DRAM AND METHOD OF REFRESHING THE MEMORY MODULE

[75] Inventor: Manabu Wada, Nagoya, Japan

[73] Assignee: Seiko Epson Corporation, Tokyo, Japan

[21] Appl. No.: 250,715

[22] Filed: May 27, 1994

[30] Foreign Application Priority Data

May 27, 1993 [JP] Japan ..................... 5-151465

[51] Int. Cl.⁶ .................................. G06F 11/10
[52] U.S. Cl. ............... 365/222; 365/228; 395/433; 395/442
[58] Field of Search ..................... 365/222, 226, 365/228, 227; 395/425

[56] References Cited

U.S. PATENT DOCUMENTS

| | | | |
|---|---|---|---|
| 4,977,537 | 12/1990 | Dias et al. | 365/22 |
| 5,229,970 | 7/1993 | Lee et al. | 365/222 |
| 5,247,655 | 9/1993 | Khan et al. | 395/550 |
| 5,262,998 | 11/1993 | Mnich et al. | 365/222 |
| 5,365,487 | 11/1994 | Patel et al. | 365/226 |

FOREIGN PATENT DOCUMENTS 0002030 1/1979 Japan.
0091194 4/1991 Japan.

*Primary Examiner*—Viet Q. Nguyen
*Attorney, Agent, or Firm*—Hickman & Beyer

[57] ABSTRACT

The present invention provides a memory module using a large capacity DRAM without a self-refresh mode, which maintains the contents of the memory irrespective of non-input of a refresh signal from a computer. A memory module (20) includes twenty DRAMs (24) soldered on a surface and rear face of a substrate (22). A connector (26) equiped on an edge of the substrate (22) is inserted into a memory extension slot (8) of a computer (1) to connect the substrate (22) electrically with the computer (1). When the computer (1) outputs refresh signals RASm and CASn within or at intervals of 500 nanoseconds, a gate array (28) included in the memory module (20) outputs these RASm and CASn signals to the DRAMs (24). When 500 nanoseconds have elapsed since fall of both the RASm and CASn signals to a low level, on the other hand, the gate array (28) generates artificial refresh signals RFRS and RFCS, splits the RFRS signal into five and the RFCS signal into four, and outputs the split signals to the DRAMs (24).

6 Claims, 7 Drawing Sheets

| | | | | | (4M DRAM) | (16M DRAM) |
|---|---|---|---|---|---|---|
| RASG | (17) | (18) | (19) | (20) | 10M | 28M |
| RASF | (13) | (14) | (15) | (16) | 8M | 20M |
| RASE | (9) | (10) | (11) | (12) | 6M | 12M |
| RASD | (5) | (6) | (7) | (8) | 4M | 4M |
| RASC | (1) | (2) | (3) | (4) | 2M | 2M |
| | 0  7<br>CAS 1 | 8  15<br>CAS 2 | 16  23<br>CAS 3 | 24  31<br>CAS 4 | | |

| JP2 | JP3 | GATE OPENED | OR11 INPUT |
|---|---|---|---|
| H | H | AND11 | 16 μsec CLOCK |
| L | H | AND12 | 32 μsec CLOCK |
| H | L | AND13 | 64 μsec CLOCK |
| L | L | AND14 | 128 μsec CLOCK |

MEMORY MODULE USING DRAM AND METHOD OF REFRESHING THE MEMORY MODULE

This application claims the priority of Japanese application Ser. No. 5-151465 filed May 27, 1993 which is incorporated herein by reference in this entirety.

BACKGROUND OF THE INVENTION

1. Field of the Invention

The present invention relates to a memory module installed in a memory extension slot of a computer, and more specifically to a memory module using a DRAM (dynamic random access memory) which requires refreshing of memory contents at or within predetermined time intervals. The invention is also directed to a method of refreshing the memory module.

2. Description of the Related Art

An element typically used for main storage of a computer is a DRAM having a simple internal structure and readily increasing a storage capacity. For the reason of cost reduction and appropriate specification, a general computer has only a DRAM, having a capacity sufficient for allowing operation of typical software, as a main memory unit. When the user requires a larger storage capacity, a separately available memory module having a DRAM is inserted into a memory extension slot of the computer. This realizes inexpensive and easy extension of the storage area.

The DRAM used for data storage in the computer stores information by accumulated charges in a capacitor. A refreshing process for re-writing the memory contents at predetermined intervals is thus required for effective data storage and retention. When the computer executes such refreshing process, however, large loading applied onto the computer undesirably decreases the speed of data processing of the computer. An improved DRAM recently proposed has a self-refresh mode for executing the refreshing process. The DRAM having the self-refresh mode does not require output of an instruction signal or an address signal for refreshing (hereinafter referred to as refresh signal) from the computer to the DRAM, and works as if the memory module is constructed as an SRAM (static random access memory). This effectively reduces the loading applied onto a CPU of the computer with the DRAM.

The DRAM having the self-refresh mode includes a specific circuit for executing internal refreshing. This specific circuit, however, has a complicated structure and occupies a large space in a restricted area of a semi-conductor chip. The self-refresh mode is accordingly applied to DRAMs having a relatively small storage capacity. The computer is generally designed to output an instruction signal for refreshing, thus being applicable to a memory module which has a DRAM without the self-refresh mode and is inserted into an extension slot of the computer.

When the computer has only one memory extension slot, a memory module inserted into the extension slot should have a large capacity DRAM for significant increase of the main storage area. Since the large capacity DRAM uses substantially all the area of the semi-conductor chip for the data storage, it is extremely difficult to mount a complicated circuit for generating signals for self-refreshing on the DRAM.

A book-sized personal computer is generally designed to save power consumption, and thereby has a sleep mode in which a clock frequency is lowered or output of signals to an external device is interrupted when a keyboard or a mouse has not been used for a predetermined time period. When a memory module having a large capacity DRAM without the self-refresh mode is inserted into an extension slot of a computer with the sleep mode, output of the refresh signals from the computer to the memory module is interrupted during the sleep mode, which prevents the memory contents being refreshed and undesirably erases the memory contents.

SUMMARY OF THE INVENTION

The object of the invention is to provide a memory module using a large capacity DRAM without a self-refresh mode, which maintains the contents of the memory irrespective of non-input of a refresh signal from a computer.

The present invention is directed to a memory module including a DRAM or dynamic random access memory, which refreshes contents of the memory when an instruction signal is input at predetermined time intervals to instruct refreshing of the memory contents. The memory module is inserted into a memory extension slot of a computer to extend a storage area of the computer. The memory module further includes:

monitor means for outputting a refresh-unable signal when the computer has not output the instruction signal for a predetermined time period; and artificial refresh means for, when the monitor means outputs the refresh-unable signal, outputting an artificial refresh signal, used in place of the instruction signal, to the DRAM at specific intervals for ensuring retention of data in the DRAM.

In the memory module having the DRAM, the monitor means monitors an instruction signal output from the computer for refreshing, and outputs a refresh-unable signal when the instruction signal has not been output from a predetermined time period. The artificial refresh means receives the refresh-unable signal and outputs an artificial refresh signal to the DRAM at specific intervals for ensuring retention of data in the DRAM.

When the DRAM executes refreshing in a 'CAS before RAS' mode for outputting a column address strobe (CAS) signal prior to a row address strobe (RAS) signal, the artificial refresh means generates artificial refresh signals in place of these CAS and RAS signals. When the DRAM executes refreshing with the RAS signal and an address signal, the artificial refresh means generates artificial refresh signals in place of the RAS and address signals. The artificial refresh means may include an interval setting element for changing the specific interval for outputting the artificial refresh signal. This structure extends the refresh period to the limit of a possible memory retention period of the DRAM, thus reducing the power consumed in the memory module.

These and other objects, features, aspects, and advantages of the present invention will become more apparent from the following detailed description of the preferred embodiment with the accompanying drawings.

DESCRIPTION OF THE PREFERRED EMBODIMENT

Figure 1:
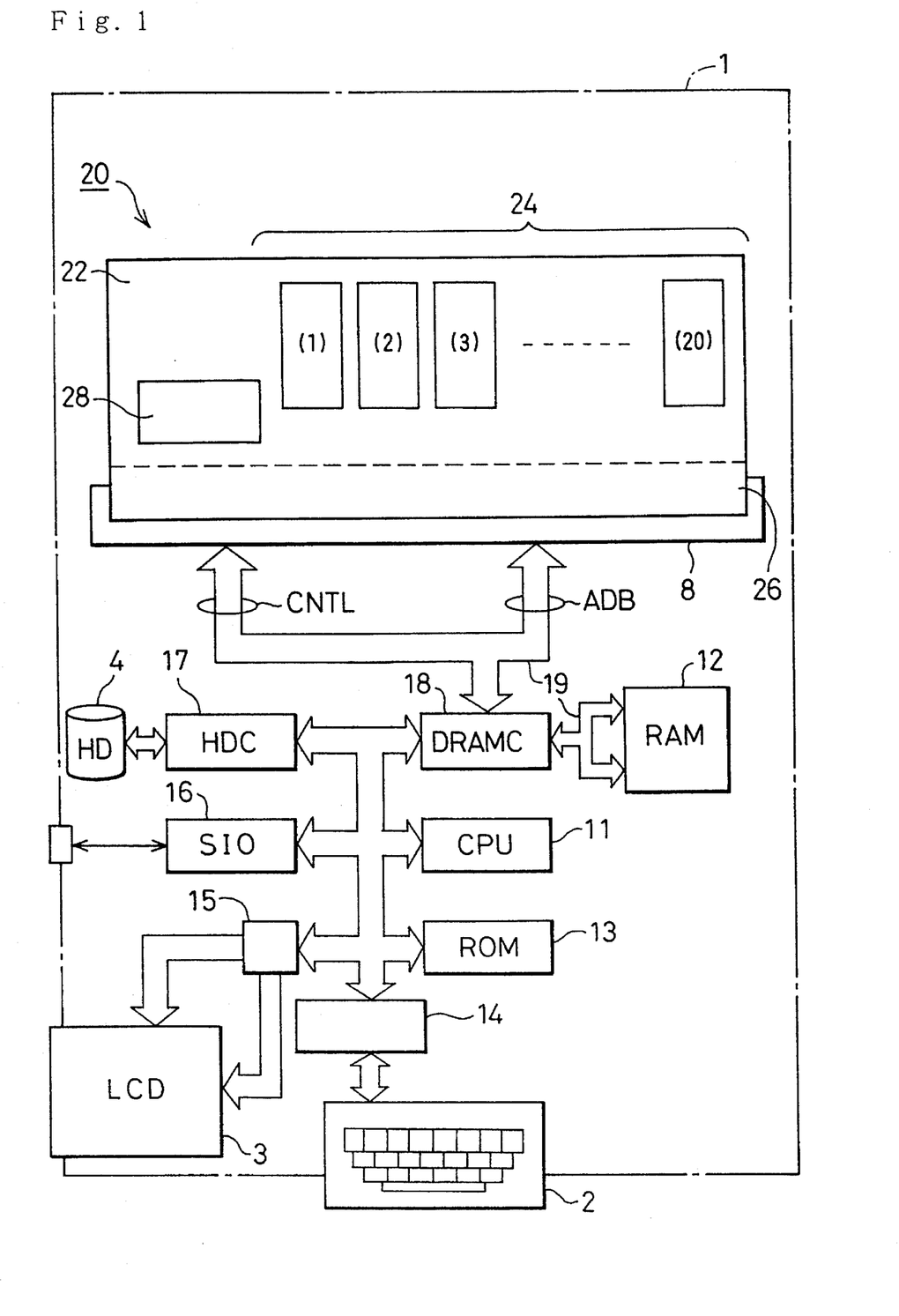
FIG. 1 is a block diagram showing a memory module 20 using a DRAM as one embodiment according to the invention.
Figure 2:
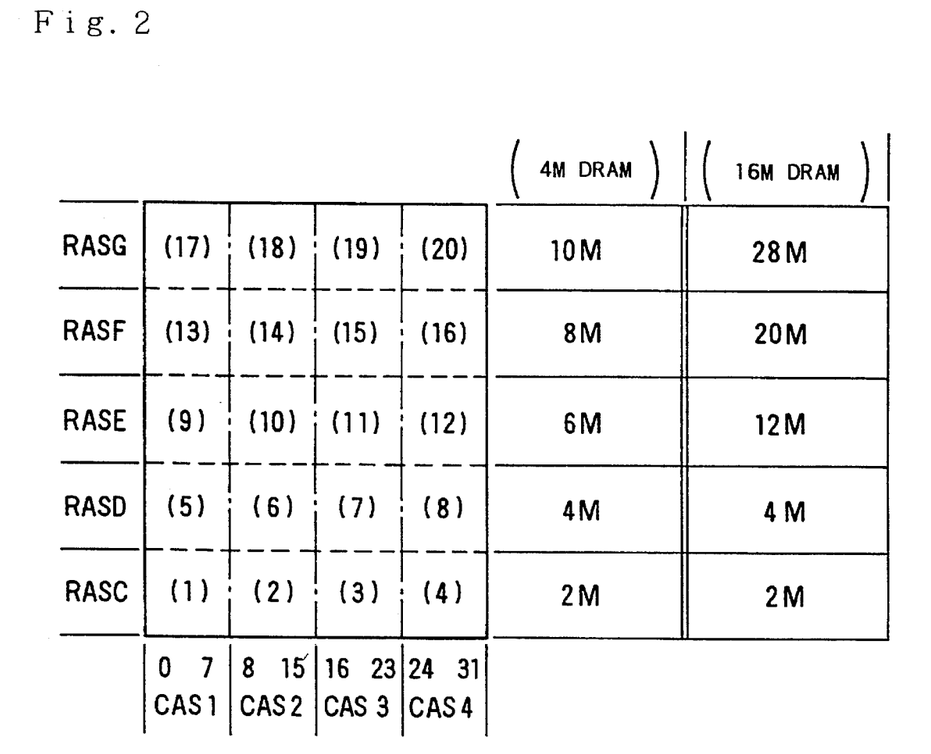
FIG. 2 shows a memory address in the memory module 20.
Figure 3:
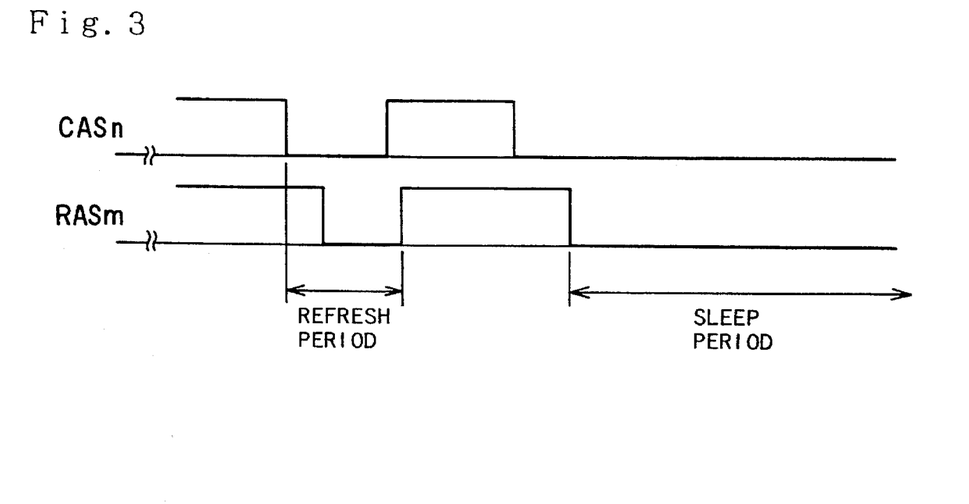
FIG. 3 is a timing chart showing refresh signals CAS and RAS.

Referring to FIGS. 1 through 3, a memory module 20 embodying the invention includes a total of twenty 16 megabit-DRAMs 24 which are soldered directly on a surface and rear face of a substrate 22. A connector 26 equiped on an edge of the substrate 22 includes a number of joint pins arranged thereon. Memory module 20 is inserted into a memory extension slot 8 of a computer 1 so as to electrically connect the substrate 22 with a bus of the computer 1. Each pin of the connector 26 is connected each receptacle arranged on the connector equiped in a memory extension slot 8 of a computer 1. A gate array 28 is constructed as a control circuit for controlling input and output of information via the connector 26 and includes logic circuits as described later.

The computer i is a book-sized personal computer including a keyboard 2, a liquid crystal display (LCD) 3, and a hard disk (HD) 4. The computer 1 further includes a CPU 11, a RAM 12, a ROM 13, a keyboard interface 14, an LCD drive circuit 15, an SIO 16 for communication, a hard disk controller (HCD) 17 for controlling the hard disk 4, and a DRAM controller (DRAMC) 18 for controlling the DRAMs 24 inserted into the computer 1. These elements and circuits are mutually connected to one another via an internal bus. The internal RAM 12 and the memory module 20 placed in the extension slot 8 of the computer 1 are connected to the DRAMC 18 via a memory bus 19. The memory bus 19 includes an address data bus ADB for signals regarding with addresses and data, and a control bus CNTL for control signals used for adjusting a timing or informing occurrence of an error. Since the memory module 20 utilizes the DRAMs, address signals are multiplied in the address data bus ADB and output together with a row address strobe signal (hereinafter referred to as RAS) and a column address strobe signal (hereinafter referred to as CAS) by time division multiplexing. The address data bus ADB transfers signals including CAS1, CAS2, CAS3, CAS4, RASC, RASD, RASE, RASF, RASG, data signals DB0 through DB15, and read/write signals as described later.

The DRAMs 24 used in the embodiment have a known structure which receives the address signals synchronously with the signals RAS and CAS by a time sharing method for a reduced number of input/output pins of a DRAM package. Each DRAM 24 has a storage area of as large as 16 megabit mounted on a predetermined area of a semi-conductor chip, and thereby does not include a self-refresh mode for generating the signals RAS and CAS.

The memory module 20 of the embodiment has a memory address structure shown in FIG. 2, wherein addresses of the twenty DRAMs 24 are specified by signals RASC through RASG, which are generated by dividing the RAS into five, and by signals CAS1 through CAS4, which are generated by dividing the CAS into four. The memory module 20 of the embodiment is designed specifically for memory expansion of a computer where the RASC and RASD signals correspond to only 4 megabit-DRAMs. Even when each DRAM 24 used herein has the capacity of 16 megabit, a storage area of only 4 megabytes is utilized for eight DRAMs having addresses specified by the RASC and RASD signals. Accordingly, a storage area having a total volume of 28 megabytes is prepared for the twenty 16 megabit-DRAMs 24.

In order to refresh the DRAMs 24 used in the embodiment, the signals RAS and CAS should be output at a timing specified for a refresh mode or period shown in FIG. 3. In this refresh mode which is often referred to as 'CAS before RAS', a signal RASm (m denotes C through G) falls to a low level after a predetermined delay time has elapsed since a time point when a signal CASn (n denotes 1 through 4) falls low.

When the memory module 20 thus constructed is installed in the memory extension slot 8 of the computer 1, the DRAMC 18 of the computer 1 outputs to the memory module 20 via the connector 26 the signals RAS and CAS satisfying the above standards as well as a 1 MHz-clock (CLK) signal, control signals for instructing 'read' or 'write', and 'write data' signals to be stored. The memory module 20, on the other hand, outputs 'read data' signals and 'error' signals.

As the memory module 20 receives the signals RAS and CAS output from the DRAMC 18 at predetermined time intervals, the DRAMs 24 on the memory module 20 are continually refreshed to maintain the contents of the memory. When the computer is in a sleep mode or period when signal outputs from the computer are interrupted, however, both the signals RAS and CAS are kept in the low level as shown in FIG. 3. This erases the contents of a conventional memory module having DRAMs without the self-refresh mode.

The memory module 20 of the embodiment, however, has logic circuits in the gate array 28, which independently generate RAS and CAS by utilizing the CLK signal output from the computer and maintain the contents of the memory. The logic circuits installed in the gate array 28 are described in detail based on the circuit diagrams of FIGS. 4 through 7.

Figure 4:
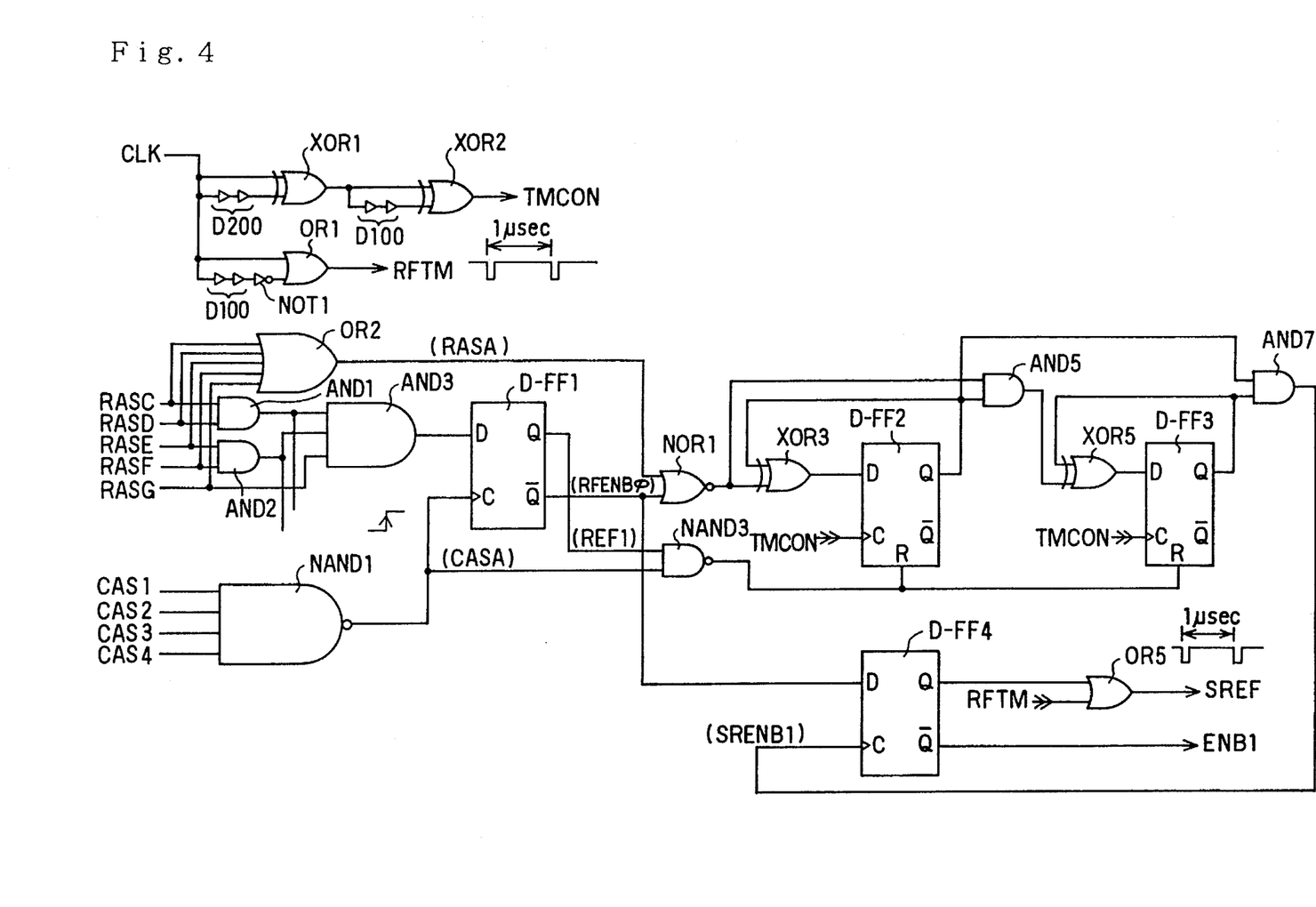
FIG. 4 is a logic circuit diagram showing a monitor circuit installed in a gate array 28 of the memory module 20.

FIG. 4 is a logic circuit diagram showing a monitor circuit which receives the 1 MHz-CLK signal, RASm, and CASn output from the computer and generates an ENB1 signal and an SREF signal. The ENB1 signal rises to a high (H) level when 500 nanoseconds (hereinafter referred to as nsec) have been elapsed since falls of both the RASm and CASn to a low (L) level. The SREF signal functions as a 1-microsecond (hereinafter referred to as µsec) clock signal.

The CLK signal output from the computer is input directly into one input terminal of an exclusive-OR (hereinafter referred to as XOR) circuit XOR1 and via a 200-nsec delay circuit D200 into the other input terminal of the XOR1. A subsequent circuit XOR2 receives an output of the XOR1 directly at one input terminal and via a 100-nsec delay circuit D100 at the other input terminal, and outputs a TMCON signal. The TMCON signal accordingly has a frequency defined by dividing the frequency of the CLK signal (1 cycle: 1 µsec) into four. Since the delay circuits D100 and D200 respectively delay signals by 100 nsec and 200 nsec, the TMCON signal is generated by decomposing a half cycle of the CLK signal to 100 nsec×3+200 nsec.

Figure 8:
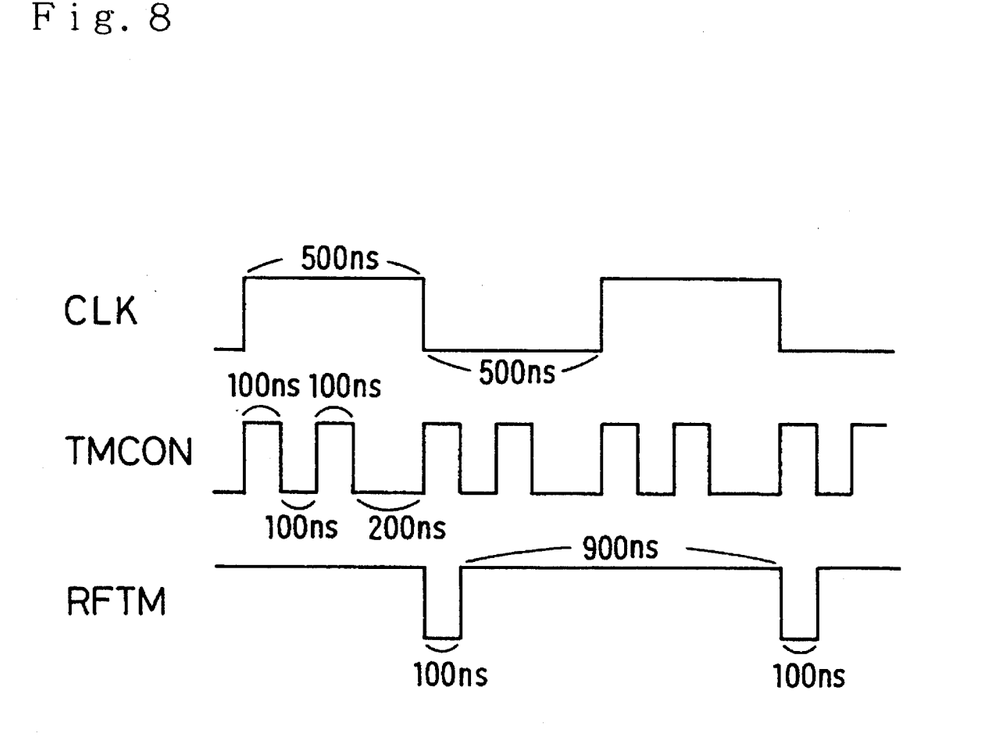
FIG. 8 is a timing chart showing a variety of clock signals generated in the monitor circuit.

The CLK signal is also input directly into one input terminal of a logic sum (hereinafter referred to as OR) circuit OR1 and via a 100-nsec delay circuit D100 and a negative (hereinafter referred to as NOT) circuit NOT1 into the other input terminal of the OR1. The OR1 subsequently outputs an RFTM signal which falls to an 'L' (low) level for a time period of 100 nsec at 1 μsec cycles as shown in FIG. 8.

The RASC and RASD signals output from the computer 1 are input into a logic multiplication (hereinafter referred to as AND) circuit AND1 while the RASE and RASF signals are input into an AND2 circuit. An AND3 circuit receives outputs of the AND1 and AND2 and the signal RASG, and outputs an AND of all the RASm signals to a D input terminal of a D-flip flop (hereinafter referred to as D-FF) circuit D-FF1. A clock terminal (hereinafter may be referred to as C terminal) of the D-FF1 receives an output signal (hereinafter referred to as CASA) of an NAND1 circuit for NOT-AND operation of all the CASn signals output from the computer 1. The D-FF1 circuit accordingly latches the signal input into a data (D) terminal when any of the CASn signals falls to the low level.

During normal access from the computer 1 to the memory module 20, the RASm signal is in the 'L' level at a time of a fall of the CASn signal, and an output Q of the D-FF1 circuit is maintained in the 'L' level. While the RASm and CASn signals are normally output at the timing of 'CAS before RAS' for refreshing, on the other hand, the output Q of the D-FF1 circuit (hereinafter referred to as REF1 signal) is kept in the 'H' level and an inverted output Q(N) (hereinafter referred to as RFEENB0 signal) is kept in the 'L' level. All the RASm signals are also input into an OR2 circuit, which generates an OR of the RASm signals (hereinafter referred to as RASA signal).

The RASA signal, the RFENB0 signal, the REF1 signal, the TMCON signal, and the RFTM signal thus generated are input into a synchronous counter element, which includes D-FF2, D-FF3, and D-FF4 circuits and generates the target signals ENB1 and SREF.

The synchronous counter element includes: an NOR1 circuit for performing NOR operation of the RASA signal and the RFENB0 signal; an XOR3 circuit for performing XOR operation of an output of the NOR1 circuit and an output Q of the D-FF2 circuit and generating an output into a D terminal of the D-FF2; an AND5 circuit for AND operation of the output of the NOR1 circuit and the output Q of the D-FF2 circuit; a XOR5 for performing XOR operation of an output of the AND5 and an output Q of the D-FF3 circuit and generating an output into a D terminal of the D-FF3; an AND7 circuit for AND operation of the outputs Q of the D-FF2 circuit and the D-FF3 circuit; a D-FF4 receiving an output of the AND7 circuit (hereinafter referred to as SRENB1 signal) as a C terminal input and the RFENB0 signal as a D terminal input; and an NAND3 circuit for outputting a result of NAND operation of the REF1 signal and the CASA signal into reset (R) terminals of the D-FF2 and D-Ff3 circuits. The TMCON signal is input into C terminals of the D-FF2 and D-FF3 circuits.

When the refresh signal is output at the timing of 'CAS before RAS' or when both the RASm and CASn signals are in the low level during the sleep period of the computer, the result of the NAND operation of the REF1 signal and the CASA signal is in the low level corresponding to the CASn signal. Otherwise, the output of the NAND3 is in the high level, when the D-FF2 and D-FF3 circuits receiving the output of the NAND3 circuit at the R terminal are initialized. Namely, the output of the D-FF3 circuit does not become active during normal access to the memory module 20.

While the refresh signal is output in the 'CAS before RAS' mode, the D-FF2 and D-FF3 circuits may be activated. Since the outputs of the D-FF2 and the D-FF3 circuits are varied synchronously with the clock signal TMCON, however, the D-FF2 and D-FF3 circuits are returned to their initial state before the output of the D-FF3 rises to the high level.

The D-FF2 and D-FF3 circuits are not activated to the final state until output of the refresh signals RASm and CASn is interrupted while the computer is in the sleep mode. The output of the D-FF3 circuit rises to the high level when the D-FF3 receives two clocks of the TMCON signal generated by dividing the frequency of the 1-μsec signal into four. Since the XOR3 and XOR5 circuits perform XOR operation of a current-stage output and a previous-stage output, the output of the AND7 circuit once rising to the high level is inverted at every cycle of the clock signal TMCON. The D-FF4 circuit receives the SRENB1 signal output from the AND7 circuit at its C terminal, and repeatedly detects the sleep mode while the refresh signals are not output. The D-FF4 circuit latches the inverted output Q(N) of the D-FF1 circuit, that is, the RFENB0 signal, input into its D terminal. When the sleep mode is canceled and the RFENB0 signal rises to the high level, the D-FF4 circuit latches the RFENB0 signal at a rise of the SRENB1 signal. This makes one of the inputs into an OR5 circuit high. The OR5 circuit performs OR operation of the RFTM signal and an output Q of the D-FF4 circuit and generates the result of the OR operation as the 1-μsec clock signal SREF, which is used for generation of an artificial refresh signal. An inverted output Q(N) of the D-FF4 circuit, on the other hand, forms the ENB1 signal, which rises to the 'H' level when 500 nsec have been elapsed since falls of both the RASm and CASn to the 'L' level.

When the sleep mode is canceled and an access signal to the memory module 20 is output after the synchronous counter element once counts up to detect the sleep mode, output of the artificial refresh signal should be interrupted immediately. When the normal access to the memory module 20 is resumed, the inverted output Q(N) of the D-FF1 circuit rises to the high level. The output Q of the D-FF4 circuit thereby rises to the high level at a next rise of the output of the AND7 circuit or the SRENB1 signal. This masks the RFTM signal and eliminates the artificial refresh signal.

Figure 5:
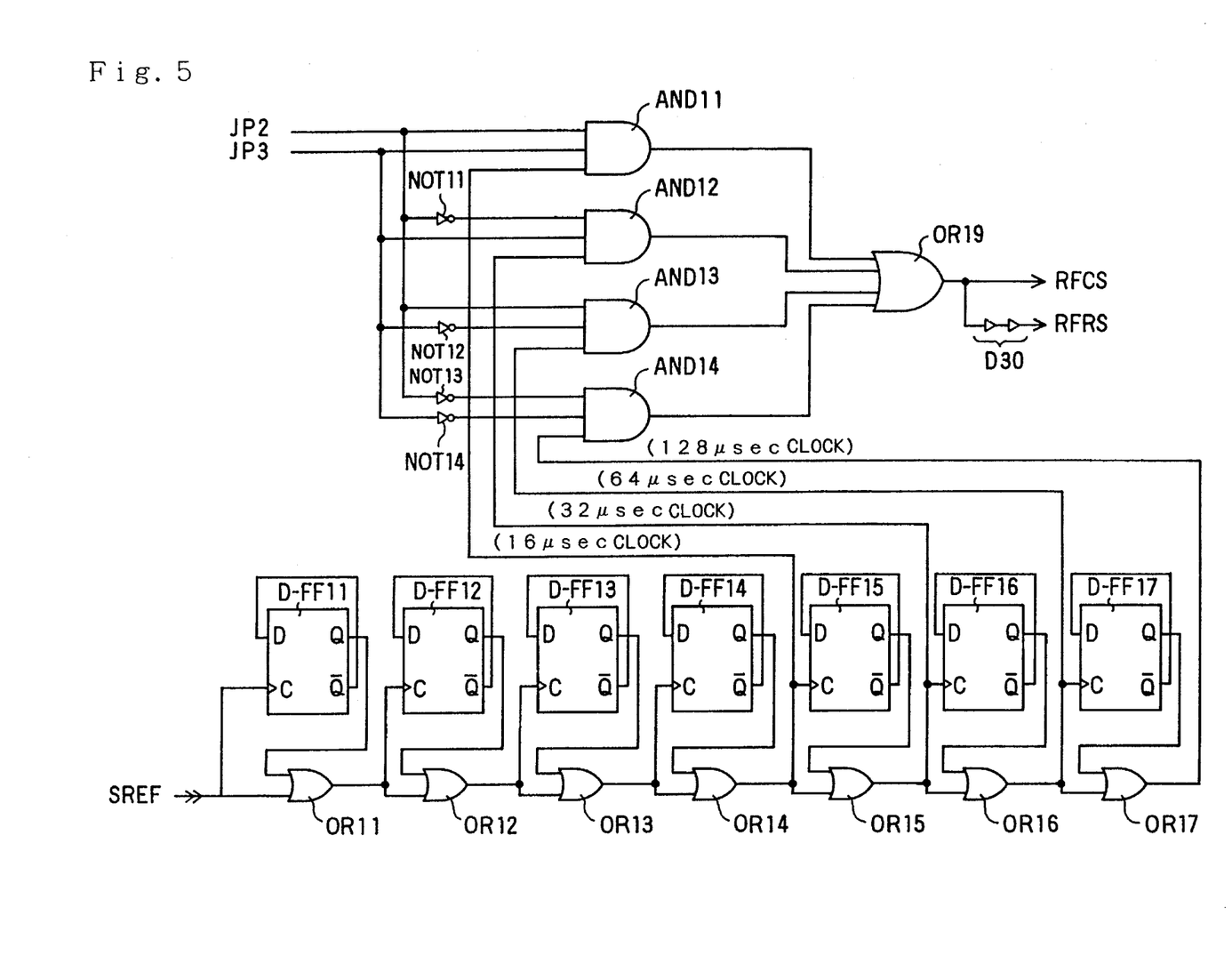
FIG. 5 is a logic circuit diagram showing an artificial refresh signal generating circuit installed in the gate array 28 of the memory module 20.

The 1-μsec clock signal SREF is used as a reference clock of an artificial refresh signal generating circuit shown in FIG. 5. The artificial refresh signal generating circuit includes a clock generating circuit defined by seven frequency-dividing circuits, which are arranged in series and consist of seven D-F11 through D-FF17 circuits and seven OR11 through OR17 circuits. The artificial refresh signal generating circuit also includes four AND circuits AND11 through AND14 used for selection of a desired clock signal among clock signals of various cycles output from the clock generating circuit, and an OR19 circuit for OR operation of outputs of the AND11 through AND14 circuits.

In the seven-stage frequency-dividing circuits respectively consisting of the D-F11 through D-FF17 circuits and the OR11 through OR17 circuits, each of the OR11 through OR17 circuits performs OR operation of an output Q from a current-stage D-FF circuit and an input into the C terminal of the current-stage D-FF circuit, and outputs a result of the OR operation to a C terminal of a next-stage D-FF circuit. Each inverted output Q(N) of the current-stage D-FF is directly returned into a D terminal of the current-stage D-FF circuit. The 1-μsec clock signal SREF is input into a C terminal of the first-stage D-FF11 and an input terminal of the first-stage OR11. Each clock signal output from each stage falls to the low level in a time period of approximately 100 nsec at every cycle. In the frequency dividing process at each stage where the cycle is successively doubled, output signals of the fourth-stage OR14, the fifth-stage OR15, the sixth-stage OR16, and the seventh-stage OR17 are respectively a 16-μsec clock signal, a 32-μsec clock signal, a 64-μsec clock signal, and a 128-μsec clock signal.

These 16-μsec, 32-μsec, 64-μsec, and 128-μsec clock signals are respectively input into the AND11 through AND14 circuits, which also receive, as selecting signals, JP2 and JP3 signals having logic levels defined by jumper wires according to the following logic. Both the JP2 and JP3 signals are input directly into the AND11 circuit which receives the 16-μsec clock signal. The JP3 signal and an inverted JP2 signal by a NOT11 circuit are input into the AND12 circuit which receives the 32-μsec clock signal. The JP2 signal and an inverted JP3 signal by a NOT12 circuit are input into the AND13 circuit which receives the a 64-μsec clock signal. An inverted JP2 signal by a NOT13 circuit and an inverted JP3 signal by a NOT14 circuit are input into the AND14 circuit which receives the 128-μsec clock signal.

Figure 9:
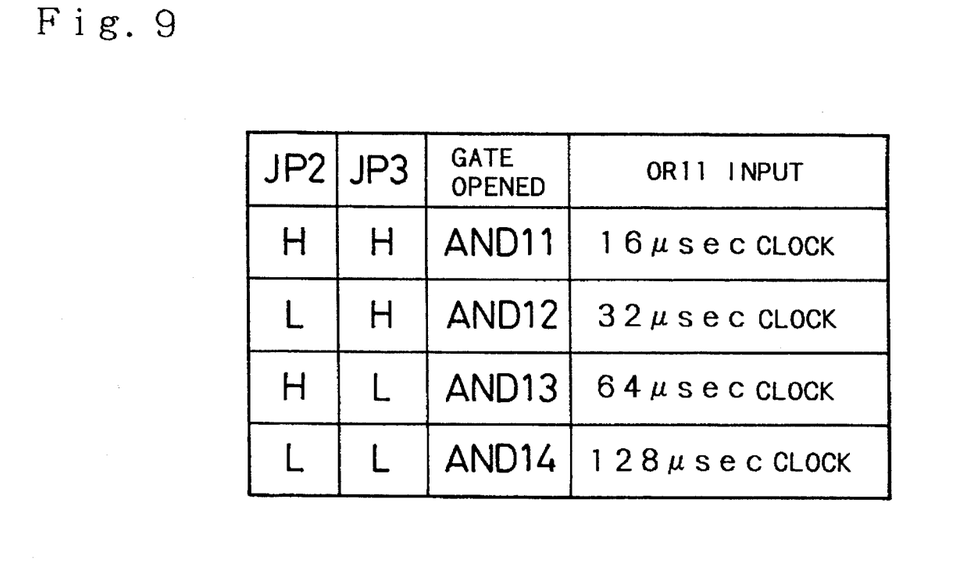
FIG. 9 shows relations of clock signals output from the artificial refresh signal generating circuit.

As shown in FIG. 9, when both the JP2 and JP3 signals are in the 'H' (high) level, the 16-μsec clock signal is output from the AND11 circuit to the subsequent OR19 circuit. When only the JP2 signal is in the 'L' level, the 32-μsec clock signal is output from the AND12 circuit to the OR19 circuit. When only the JP3 signal is in the 'L' level, the 64-μsec clock signal is output from the AND13 circuit to the OR circuit. When both the JP2 and JP3 signals are in the 'L' level, the 128-μsec clock signal is output from the AND14 circuit to the OR19 circuit. A desired clock signal selected out of the four clock signals is output from the OR19 circuit according to a combination of the JP2 and JP3 signals. The OR19 circuit generates the output as an artificial CAS (hereinafter referred to as RFCS signal) whereas a delay circuit D30 delays the output of the OR19 circuit by approximately 30 nsec to generate an artificial RAS (hereinafter referred to as RFRS signal).

The JP2 and JP3 signals are arbitrarily output through operation of the jumper wires or dip switches. A power consumed by the memory module 20 in the sleep mode is substantially determined by the refresh cycle. The longer refresh cycle is thereby preferable according to the ability of data retention of the DRAMs 24 mounted on the memory module 20. The output of the JP2 and JP3 signals is determined to attain an optimal refresh interval according to the type of the DRAMs 24 mounted.

Figure 6:
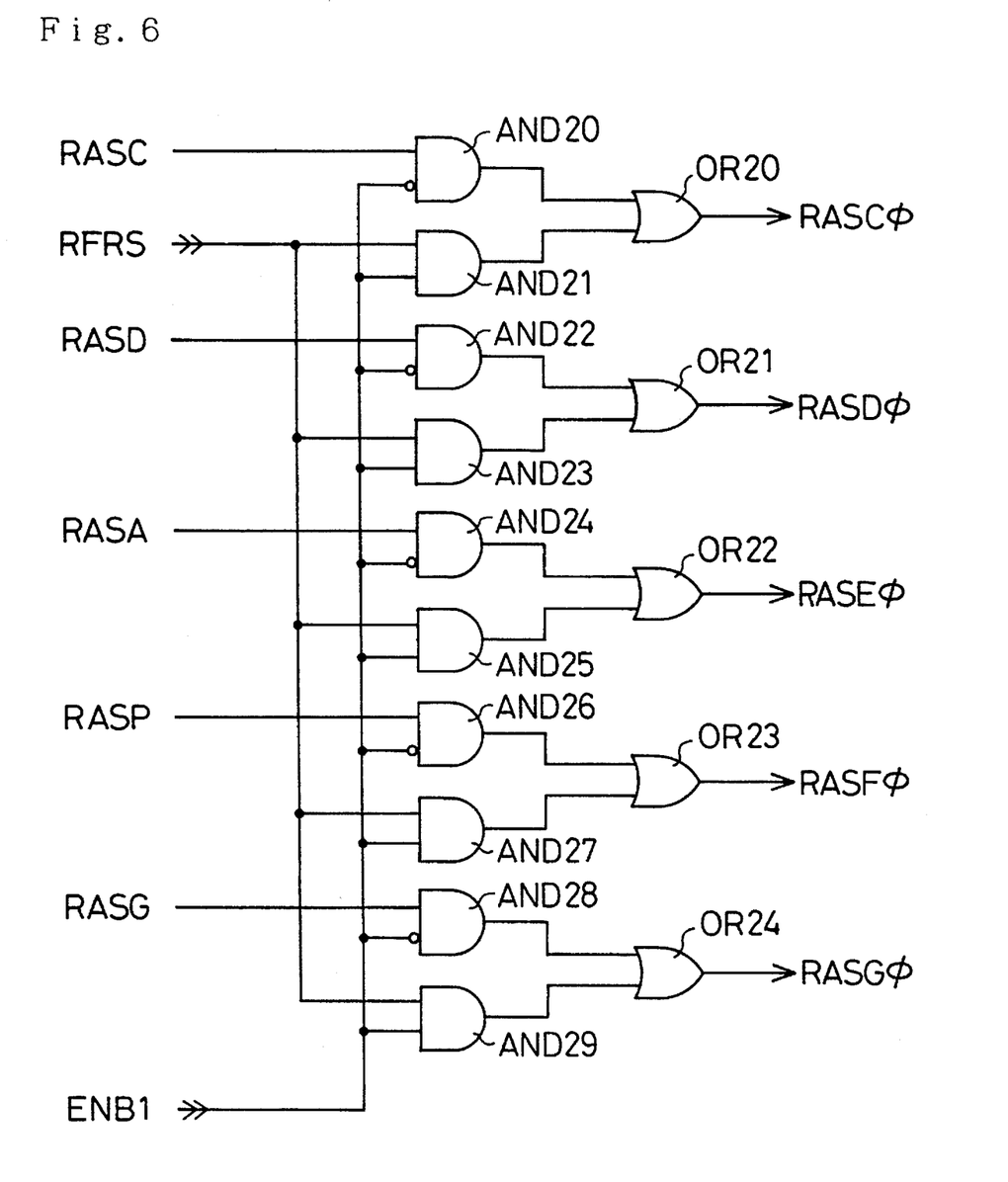
FIG. 6 is a logic circuit diagram showing an RAS distributing circuit installed in the gate array 28.
Figure 7:
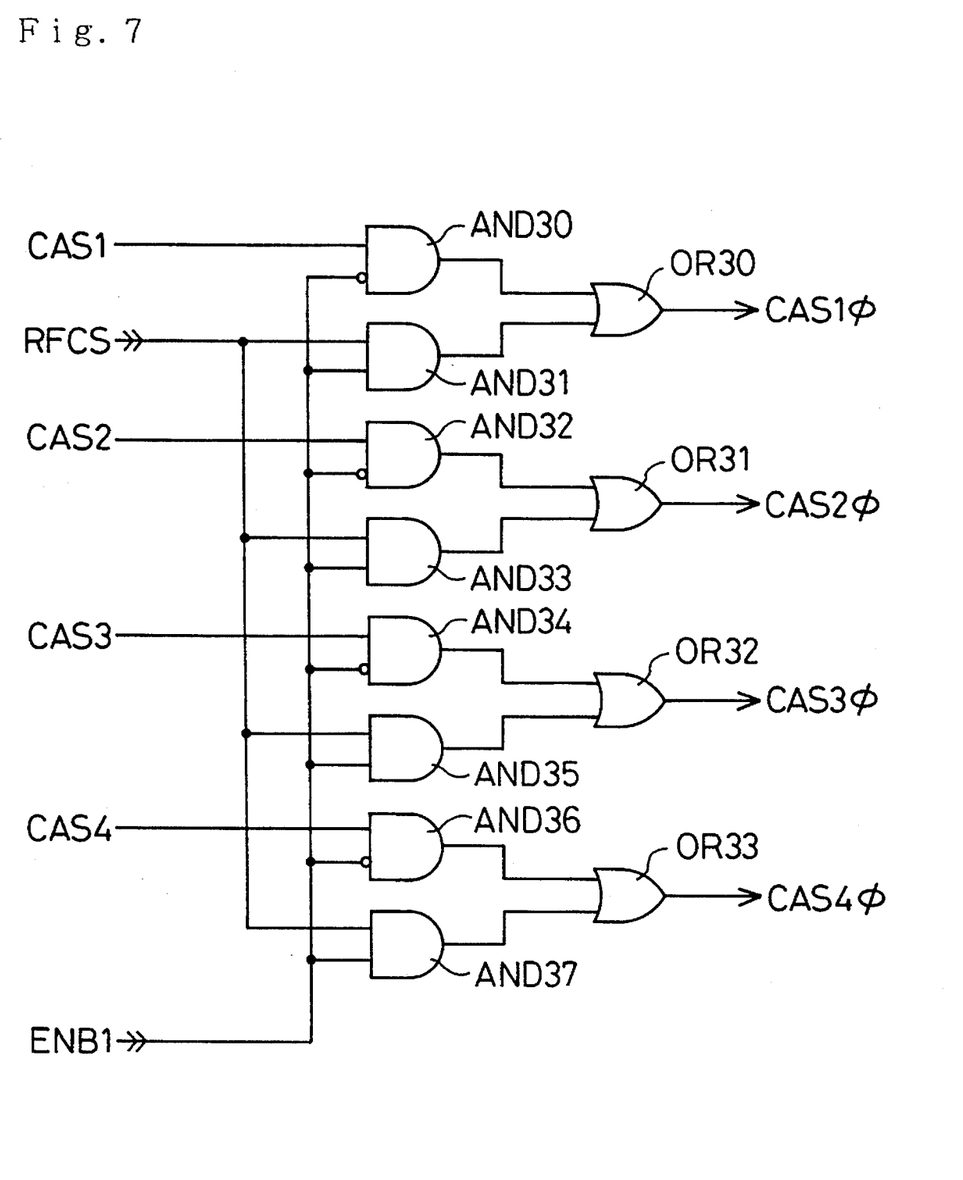
FIG. 7 is a logic circuit diagram showing a CAS distributing circuit installed in the gate array 28.

The RFRS signal and the RFCS signal of arbitrary frequencies obtained in the artificial refresh signal generating circuit of FIG. 5 are respectively input, together with the ENB1 signal obtained in the monitor circuit of FIG. 4, into RAS and CAS distributing circuits shown in FIGS. 6 and 7. These distributing circuits generate final refresh instruction signals, that is, RAS and CAS signals in the embodiment, given to the DRAMs 24 on the memory module 20.

The RAS distributing circuit of FIG. 6 is constructed as a logic circuit including 10 AND circuits AND20 through AND29 and five OR circuits OR20 through OR24. The RASm output from the computer is input into the AND20, AND22, AND24, AND26, and AND28 circuits whereas the RFRS signal obtained in the circuit of FIG. 5 is input into the AND21, AND23, AND25, AND27, and AND29 circuits. The ENB1 signal obtained in the circuit of FIG. 4 is input as a gate signal inversely into the AND20, AND22, AND24, AND26, and AND28 circuits and directly into the AND21, AND23, AND25, AND27, and AND29 circuits. Namely, gates of either the first set including AND20, AND22, AND24, AND26, and AND28 or the second set including the AND21, AND23, AND25, AND27, and AND29 are opened according to the value of the ENB1 signal. The OR20 circuit for OR operation of the outputs of the AND20 and AND21, the OR21 circuit for OR operation of the outputs of the AND22 and AND23, the OR22 circuit for OR operation of the outputs of the AND24 and AND25, the OR23 circuit for OR operation of the AND26 and AND27, and the OR24 circuit for OR operation of the AND28 and AND29 respectively generate signals RASCϕ, RASDϕ, RASEϕ, RASFϕ, and RASGϕ, which are utilized as the RAS for the DRAMs 24. This circuit is easily replaced by a 5-bit data selector.

When the RASm and CASn signals are input from the computer to the memory module 20 at intervals within 400 nsec, the RAS distribution circuit outputs the RASm signals as the RASCϕ, RASDϕ, RASEϕ, RASFϕ, and RASGϕ signals. When 500 nsec have elapsed since falls of both the RASm and CASn signals to the low level, on the other hand, the ENB1 signal rises to the high level and the RFRS signal generated by the circuit of FIG. 5 is outputs as the RASCϕ, RASDϕ, RASEϕ, RASFϕ, and RASGϕ signals.

The CAS distributing circuit shown in FIG. 7 has the same circuit structure as the RAS distributing circuit of FIG. 6. As the memory address structure of the memory module 20 (FIG. 2) clearly shows that only four CAS signals are required, the CAS distributing circuit forms a logic circuit with eight AND circuits AND30 through AND37 and four OR circuits OR30 through OR33. The CAS distributing circuit for generating CAS1ϕ through CAS4ϕ signals directly given to the DRAMs 24 may be replaced by a 4-bit data selector.

As described above, the memory module 20 of the embodiment inserted into the memory extension slot 8 of the computer 1 functions as part of a main memory area of the computer to extend the capacity of the main memory, like a conventional memory module with DRAMs. When output of the refresh signals RASm and CASn from the computer is interrupted, the logic circuits included in the gate array 28 generate RASmϕ and CASnϕ corresponding to the artificial signals RFRS and RFCS. These signals RASmϕ and CASnϕ are distributed to the DRAMs 24 mounted on the memory module 20, which thereby maintains the contents of the memory. Even though the memory module 20 of the embodiment includes relatively inexpensive, large capacity 16-megabit DRAMs 24 without a self-refresh mode, the memory module 20 is applicable to the computer which requires application of the self-refresh mode. When the memory module 20 is used for memory expansion of a computer having a sleep mode, like a book-sized personal computer, the contents of the memory module 20 are maintained effectively.

The logic circuits included in the gate array 28 generate artificial refresh signals RFRS and RFCS and output these artificial refresh signals at arbitrary frequencies of 16 through 128 μsec using the JP2 and JP3 signals. This structure allows the best use of the memory retention ability of the DRAMs 24, and saves the power required for unnecessary refreshing process.

There may be many modifications, alternations, and changes without departing from the scope or spirit of essential characteristics of the invention. It is thus clearly understood that the above embodiment is only illustrative and not restrictive in any sense. Some examples of such modification include that the gate array 28 may be replaced by another logic circuit such as a custom IC and that the memory module 20 may include a battery for memory retention during a power-off period of the computer.

The scope and spirit of the present invention are limited only by the terms of the appended claims.

What is claimed is:

1. A memory module comprising a dynamic random access memory (DRAM) that does not include a self-refresh mode, the memory module being arranged to refresh contents of said memory when an instruction signal is input at predetermined time intervals to instruct refreshing of the memory contents, said memory module being inserted into a memory extension slot of a computer to extend a storage area of said computer, said memory module further comprising:

monitor means for outputting a refresh-unable signal when said computer has not output said instruction signal for a predetermined time period, the monitor means being independent of the DRAM; and artificial refresh means responsive to the refresh-unable signal for, when said monitor means outputs said refresh unable signal, outputting an artificial refresh signal, used in place of said instruction signal, to said DRAM at specific intervals for ensuring retention of data in said DRAM, the artificial refresh means being independent of the DRAM.

2. A memory module in accordance with claim 1, wherein said artificial refresh means comprises an interval setting element for changing said specific interval for outputting said artificial refresh signal.

3. A memory module in accordance with claim 1, wherein said instruction signal comprises a combination of a CAS signal or a column address strobe signal and an RAS signal or a row address strobe signal, said RAS signal being output in a specified time period after output of said CAS signal.

4. A memory module in accordance with claim 3, wherein said memory module receives plural sets of said RAS signals and CAS signals and refresh a plurality of DRAMs corresponding to said plural sets of said RAS signals and CAS signals.

5. A memory module in accordance with claim 4, wherein said artificial refresh means comprises:

first means for outputting a single artificial refresh signal;

second means for splitting said artificial refresh signal into a plurality of signals shifted at a number of different timings corresponding to said plural sets of said RAS signals and CAS signals; and third means for outputting said plurality of split signals to said plurality of DRAMs corresponding to said plural sets of said RAS signals and CAS signals.

6. A method of refreshing a memory module having a DRAM or dynamic random access memory, which does not have a self-refresh function and is inserted into a memory extension slot of a computer to extend a storage area of said computer, said method comprising the steps of:

when an instruction signal for instructing refresh of contents of said memory is input at predetermined time intervals, refreshing the contents of said DRAM using said instruction signal; and when said computer has not output said instruction signal for a predetermined time period, outputting an artificial refresh signal, used in place of said instruction signal, at specific intervals for ensuring retention of data in said DRAM.

\* \* \* \* \*

UNITED STATES PATENT AND TRADEMARK OFFICE
CERTIFICATE OF CORRECTION

PATENT NO. : 5,475,645
DATED : December 12, 1995
INVENTOR(S) : Manabu Wada

It is certified that error appears in the above-indentified patent and that said Letters Patent is hereby corrected as shown below:

On the title page, Item [73] Assignee: should read

— Melco, Inc. Nagoya, JAPAN —.

Signed and Sealed this

Second Day of July, 1996

Attest:

BRUCE LEHMAN

Attesting Officer　　　　Commissioner of Patents and Trademarks